(12) United States Patent
Fujimoto et al.

(10) Patent No.: US 8,240,902 B2
(45) Date of Patent: Aug. 14, 2012

(54) LED LINEAR LIGHT SOURCE AND DEVICES USING SUCH SOURCE

(75) Inventors: Hisayoshi Fujimoto, Kyoto (JP); Takaya Nagahata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 814 days.

(21) Appl. No.: 12/224,267

(22) PCT Filed: Feb. 22, 2007

(86) PCT No.: PCT/JP2007/053247
§ 371 (c)(1),
(2), (4) Date: Mar. 23, 2009

(87) PCT Pub. No.: WO2007/099838
PCT Pub. Date: Sep. 7, 2007

(65) Prior Publication Data
US 2009/0219586 A1    Sep. 3, 2009

(30) Foreign Application Priority Data

Feb. 23, 2006  (JP) ................................. 2006-046829
Mar. 29, 2006  (JP) ................................. 2006-090462

(51) Int. Cl.
*F21S 4/00* (2006.01)
*F21V 5/00* (2006.01)
*G09F 13/18* (2006.01)

(52) U.S. Cl. ................... 362/559; 362/217.01; 362/223; 362/246; 362/311.02

(58) Field of Classification Search ................... 362/610, 362/555, 559, 511, 217.01, 222, 223, 235, 362/236, 244, 246, 249.02, 311.01, 311.02
See application file for complete search history.

(56) References Cited

U.S. PATENT DOCUMENTS

| | | | | |
|---|---|---|---|---|
| 2,245,349 A | * | 6/1941 | Lombardl | 362/577 |
| 4,396,834 A | * | 8/1983 | Appel et al. | 358/494 |
| 4,924,357 A | | 5/1990 | Yamashita et al. | |
| 5,179,413 A | * | 1/1993 | Griffith | 399/206 |
| 5,471,327 A | * | 11/1995 | Tedesco et al. | 359/15 |
| 5,969,343 A | | 10/1999 | Nakamura et al. | |
| 6,031,958 A | * | 2/2000 | McGaffigan | 385/146 |
| 6,268,600 B1 | | 7/2001 | Nakamura et al. | |
| 6,289,150 B1 | * | 9/2001 | Zarian et al. | 385/31 |
| 6,339,214 B1 | | 1/2002 | Takakura et al. | |
| 6,601,984 B2 | * | 8/2003 | Yamamoto et al. | 362/600 |
| 6,712,492 B2 | * | 3/2004 | Shimura et al. | 362/558 |
| 6,910,783 B2 | * | 6/2005 | Mezei et al. | 362/615 |
| 7,048,427 B2 | | 5/2006 | Fujino et al. | |

(Continued)

FOREIGN PATENT DOCUMENTS

| | | |
|---|---|---|
| EP | 0 887 665 | 12/1998 |
| JP | 10-150526 | 6/1998 |
| JP | 2000-113711 | 4/2000 |

(Continued)

*Primary Examiner* — Ismael Negron
(74) *Attorney, Agent, or Firm* — Hamre, Schumann, Mueller & Larson, P.C.

(57) ABSTRACT

A linear light source device includes a light guiding member formed of a transparent body and an LED element arranged to face an end of the light guiding member. A plurality of recesses or projections are formed in a circumferential direction on the transparent body. Light from the LED element incident on the recesses or projections is reflected by the recesses or projections and travels toward the side of the light guiding member opposite to the recesses or projections to be emitted to the outside.

42 Claims, 18 Drawing Sheets

U.S. PATENT DOCUMENTS

| | | | |
|---|---|---|---|
| 7,076,148 B2 | 7/2006 | Nemoto et al. | |
| RE41,876 E * | 10/2010 | Fang | 358/509 |
| 2005/0219836 A1* | 10/2005 | Hung | 362/97 |
| 2007/0115683 A1* | 5/2007 | Park | 362/555 |
| 2009/0201675 A1* | 8/2009 | Onishi et al. | 362/223 |

FOREIGN PATENT DOCUMENTS

| | | |
|---|---|---|
| JP | 2000-134413 | 5/2000 |
| JP | 2005-17545 | 1/2005 |
| JP | 2006-3638 | 1/2006 |
| KR | 10-262237 | 7/2000 |

* cited by examiner

LED LINEAR LIGHT SOURCE AND DEVICES USING SUCH SOURCE

TECHNICAL FIELD

The present invention relates to a linear light source device, while also relating to an image reader and a flat display apparatus using a linear light source device. Particularly, the present invention relates to a linear light source device which is suitably used as an illumination light source of an image reader such as an image scanner or used as a backlight of a flat display apparatus such as a liquid crystal display apparatus.

BACKGROUND ART

A flat-bed image scanner is disclosed in e.g. Patent Document 1. The image scanner utilizes an image sensor unit U in which a CCD line sensor is mounted. (Hereinafter, this unit is referred to as a "CCD image sensor unit"). As shown in FIG. 11 of the present application, such a CCD image sensor unit U generally includes an illumination light source 1, a plurality of mirrors 21-25, a lens 3 and a CCD line sensor 4 which are housed in a case 5. In the flat-bed image scanner S, the CCD image sensor unit U is moved in the secondary scanning direction (right and left direction in FIG. 11) below a document table DP made of e.g. transparent glass. In the operation to read the image of the document, the light emitted from the illumination light source 1 and then reflected by the document D is reflected by the mirrors 21-25 to converge on the CCD line sensor 4 via the lens 3. Thus, the image of one line of the document D extending in the primary scanning direction (the direction perpendicular to the sheet surface in FIG. 11) is formed on the CCD line sensor 4 and read. This operation is repeated every time the CCD image sensor unit U is moved in the secondary scanning direction by a predetermined pitch, whereby the two dimensional image of the document is read.

In the flat-bed image scanner S utilizing the CCD image sensor unit U, the light path from the document D to the CCD line sensor 4 is relatively long, so that a large depth of field of the lens 3 is provided. Thus, even when the document D is slightly separated from the surface of the document table DP, clear image is obtained without defocusing.

Patent Document 1: JP-A-2000-134413

Generally, a cold-cathode tube which emits white light is used as the illumination light source 1 of the CCD image sensor unit U. This is because, at present, in view of the cost and so on, a cold-cathode tube is considered to be the optimum linear light source device for irradiating the document with light of uniform illuminance throughout the entire reading range extending in the primary scanning direction for reading a color image.

However, the use of a cold-cathode tube as the linear light source device of a CCD image sensor unit U has drawbacks as follows.

Firstly, to drive a cold-cathode tube, a high voltage for discharge generated by using e.g. an inverter is necessary, so that the cost for the power supply circuit is high.

Secondly, a cold-cathode tube is not good for environment, because mercury vapor, which is harmful, is enclosed.

Thirdly, although a cold-cathode tube emits uniform light throughout the length, the amount of light received by the light receiving elements of the CCD line sensor 4 becomes smaller as progressing toward each end. Specifically, in the CCD image sensor unit U, the reading range of e.g. A4 size is finally reduced to the width of the CCD line sensor 4 which is about several tens of mm. Thus, the angle of view as viewed from the CCD line sensor 4 or the lens 3 is about 50° (see FIG. 12). Thus, the receiving amount of light reflected by the document becomes smaller as progressing toward each end of the reading range. Although such a reduction in the light receiving amount can be corrected, such correction requires a complicated correction circuit particularly when a color image is to be read.

Fourthly, the light emitted from a cold-cathode tube is not used efficiently. Specifically, although illumination is performed only in one direction, a cold-cathode tube emits light from the entire circumference, so that much light is wasted. To solve this problem, a reflective member needs to be arranged behind the cold-cathode tube, which increases the cost.

DISCLOSURE OF THE INVENTION

The present invention has been proposed under the circumstances described above. It is therefore an object of the present invention to provide a linear light source device capable of solving the above-described problems caused by the use of a cold-cathode tube as an illumination light source of an image reader incorporating a CCD line sensor such as a CCD image sensor unit. Another object of the present invention is to provide an image reader using the linear light source device as the illumination light source. Still another object of the present invention is to provide a flat display apparatus using the linear light source device as the illumination light source as the backlight.

To solve the above-described problems, the present invention takes the following technical measures.

According to a first aspect of the present invention, there is provided a linear light source device comprising a light guide member including a main body made of a transparent material to be in the form of a column having a substantially uniform cross section and a predetermined length, and a first end and a second end provided at ends of the main body, and an LED element arranged to face each of the first end and the second end. The main body includes a smooth mirror circumferential surface formed with a plurality of recesses or projections throughout the length thereof within a predetermined range in the circumferential direction. Due to the recesses or projections, throughout the length of the main body, light emitted from the LED element and introduced into the main body through each of the first end and the second end is emitted from a region of the circumferential surface of the main body which faces the range within which the recesses or the projections are formed.

As a variation of the linear light source device according to the first aspect, there is provided a linear light source device comprising a light guide member including a main body made of a transparent material to be in the form of a column having a substantially uniform cross section and a predetermined length, and a first end and a second end provided at ends of the main body, an LED element arranged to face the first end, and a reflecting portion formed at the second end. The main body includes a smooth mirror circumferential surface formed with a plurality of recesses or projections throughout the length thereof within a predetermined range in the circumferential direction. Due to the recesses or projections, throughout the length of the main body, light emitted from the LED element and introduced into the main body through the first end is emitted from a region of the circumferential surface of the main body which faces the range within which the recesses or the projections are formed.

Specifically, the reflecting portion formed at the second end may comprise a reflecting surface extending perpendicularly to an axis of the main body or two reflecting surfaces inclined substantially 45 degrees with respect to an axis of the main body. Alternatively, the reflecting portion may be in the form of a cone having a generatrix inclined substantially 45 degrees with respect to an axis of the main body or in the form of a pyramid including a ridge line inclined substantially 45 degrees with respect to an axis of the main body. Preferably, the reflecting portion may be covered with white resin or formed by vapor deposition of metal.

The transparent material for forming the main body of the light guide member may be transparent resin or transparent glass.

Specifically, the main body of the light guide member having a substantially uniform cross section may be in the form of a round column, a polygonal prism, or an oval column, for example.

In a preferred embodiment, the plurality of recesses or projections may be provided by forming a plurality of grooves extending in a direction crossing a longitudinal axis of the main body at predetermined intervals. Preferably, in this case, each of the grooves has an inner surface which is generally arcuate in cross section.

The plurality of recesses or projections may be provided by forming a plurality of dents each having a spherical inner surface.

In a preferred embodiment, the LED element comprises an LED chip, and the LED chip is directly mounted on a substrate made of aluminum nitride.

In a preferred embodiment, the substrate includes an LED element mount region for mounting the LED element and a heat dissipation region connected to the LED element mount region.

In a preferred embodiment, the substrate is formed with a common electrode pattern and a plurality of individual power supply electrode patterns. At the LED element mount region, a plurality of LED chips are bonded close to each other on the common electrode pattern, and each of the LED chips is connected to a corresponding one of the individual power supply electrode patterns via a wire.

In a preferred embodiment, the substrate is elongated. The LED element mount region is provided at one of longitudinally opposite ends of the substrate. The common electrode pattern and the individual power supply electrode patterns extend in parallel with each other on a remaining portion of the substrate in the longitudinal direction of the substrate.

In a preferred embodiment, the plurality of LED chips include at least one red LED chip, at least one green LED chip and at least one blue LED chip.

In a preferred embodiment, at least portions of the common electrode pattern and the individual power supply electrode patterns corresponding to the LED element mount region are formed by printing and baking silver paste.

In a preferred embodiment, the linear light source device further comprises a frame-shaped reflector mounted to the LED element mount region of the substrate to surround the LED chips.

In a preferred embodiment, the reflector includes an inner surface inclined to flare toward an upper opening of the reflector. The inner surface is a reflecting surface. For instance, the reflector may be entirely made of white resin so that the inner surface serves as a reflecting surface. Alternatively, the reflector may be made of resin, and the inner surface may be mirror finished by forming an aluminum film by vapor deposition.

In a preferred embodiment, the end of the light guide member which faces the LED chip is integrally formed with a socket portion fitted to the frame-shaped reflector to accommodate the reflector.

In a preferred embodiment, the socket portion includes an outer surface covered with a light-impermeable layer.

In a preferred embodiment, in the circumferential surface of the main body, the predetermined range in the circumferential direction within which the recesses or the projections are to be formed to be spaced from each other in the longitudinal direction of the main body corresponds to a central angle of 3 to 45°, and more preferably 5 to 30° of the main body.

In a preferred embodiment, in the circumferential surface of the main body, the predetermined range in the circumferential direction within which the recesses or the projections are to be formed to be spaced from each other in the longitudinal direction of the main body corresponds to a central angle of 120 to 270°, and more preferably 120 to 200° of the main body.

According to a second aspect of the present invention, there is provided an image reader comprising a light source device, a plurality of mirrors, a lens and a CCD line sensor which are housed in a case. The image reader is designed to guide light emitted from the light source device and reflected by a document to the CCD line sensor via the mirrors and the lens so that a linear image in a primary scanning direction of the document is read by the CCD line sensor. The light source device comprises the linear light source device according to the first aspect of the present invention. Preferably, in this linear light source device, the predetermined range in the circumferential direction within which the recesses or the projections are to be formed to be spaced from each other in the longitudinal direction of the main body corresponds to a central angle of 3 to 45° of the main body.

In a preferred embodiment, the plurality of recesses or projections of the main body of the light guide member are so formed that amount of light to be emitted from the main body increases as progressing from a central portion toward each end in the longitudinal direction of the main body.

According to a third aspect of the present invention, there is provided a flat display apparatus comprising a flat display panel and an illuminator for illuminating the flat display panel from behind. The illuminator is provided by arranging a plurality of linear light source devices according to the first aspect of the present invention side by side. Preferably, in these linear light source devices, the predetermined range in the circumferential direction within which the recesses or the projections are to be formed to be spaced from each other in the longitudinal direction of the main body corresponds to a central angle of 120 to 270° of the main body.

In a preferred embodiment, the flat display apparatus further comprises a light diffusion sheet or a light diffusion panel arranged between the flat display panel and the illuminator.

In a preferred embodiment, the flat display apparatus further comprises a light reflecting surface arranged on a side of the illuminator which is opposite from the flat display panel.

BEST MODE FOR CARRYING OUT THE INVENTION

Preferred embodiments of the present invention will be described below with reference to the accompanying drawings.

FIGS. 1-5 show a linear light source device 100 according to a first embodiment of the present invention. The linear light source device 100 includes a light guide member 120 and LED elements 200 arranged at the two ends of the light guide member 120.

Figure 1:
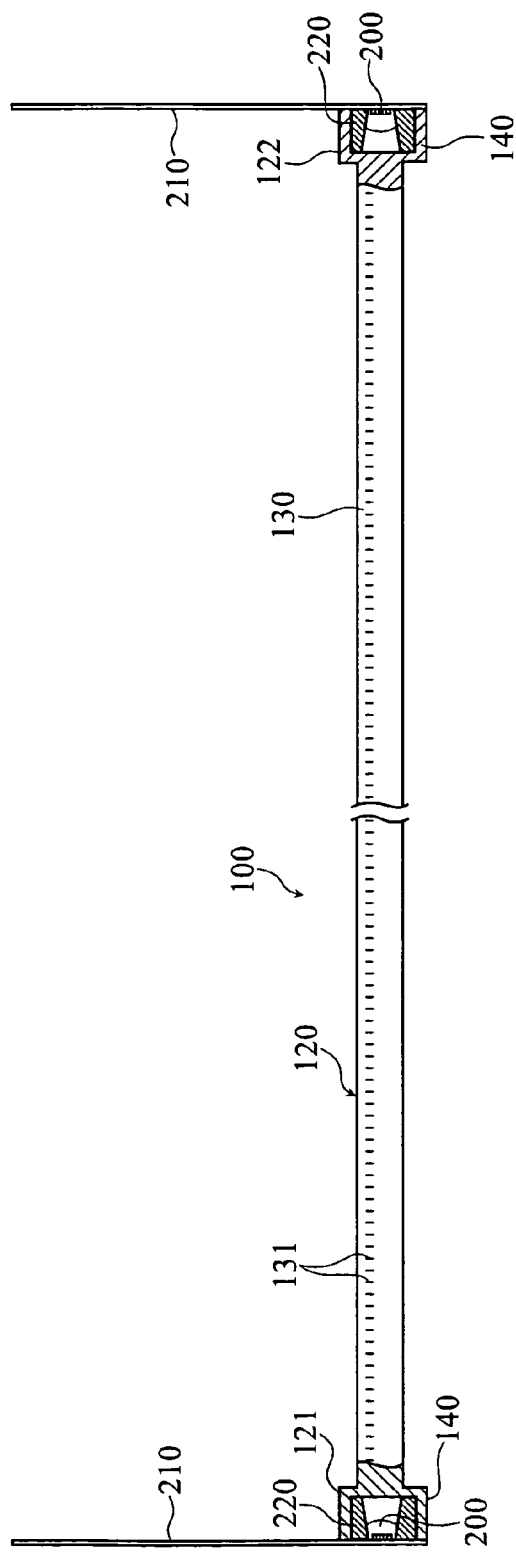
FIG. 1 is a front view, partially in section, showing the overall structure of a linear light source device according to a first embodiment of the present invention.

As shown in FIG. 1, the light guide member 120 includes a main body 130 in the form of a column having a uniform circular cross section throughout the length, and a first end 121 and a second end 122 provided at the two ends of the main body 130. The light guide member 120 is made of e.g. a transparent resin such as PMMA or polycarbonate or other transparent materials such as transparent glass to be an integral part. For instance, the columnar main body 130 has a length corresponding to the reading range of A4 size and has a diameter of about 3 mm. At least the circumferential surface of the main body 130 is a smooth mirror surface.

Figure 2:
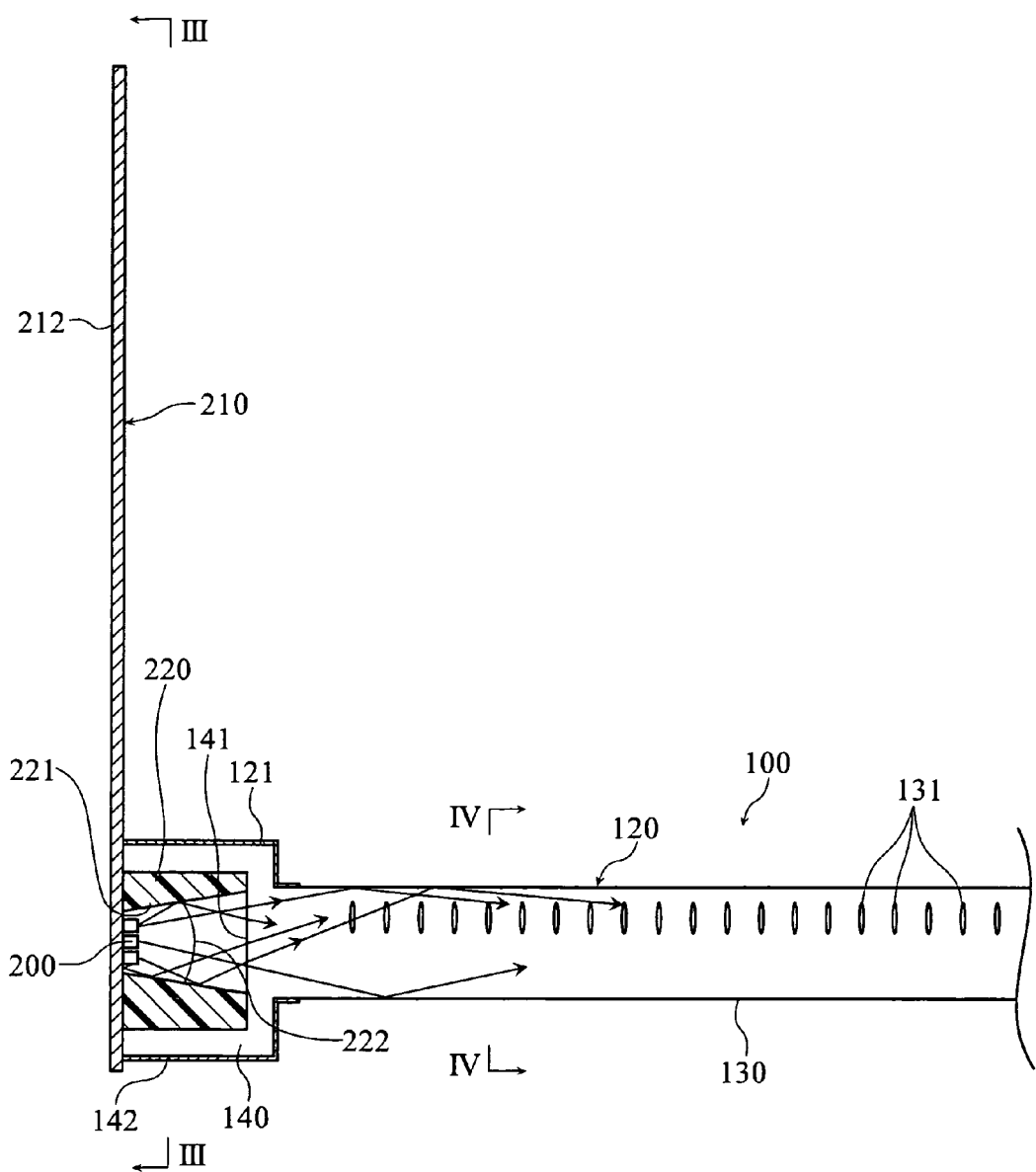
FIG. 2 is an enlarged view showing a principal portion of the linear light source device of FIG. 1.
Figure 4:
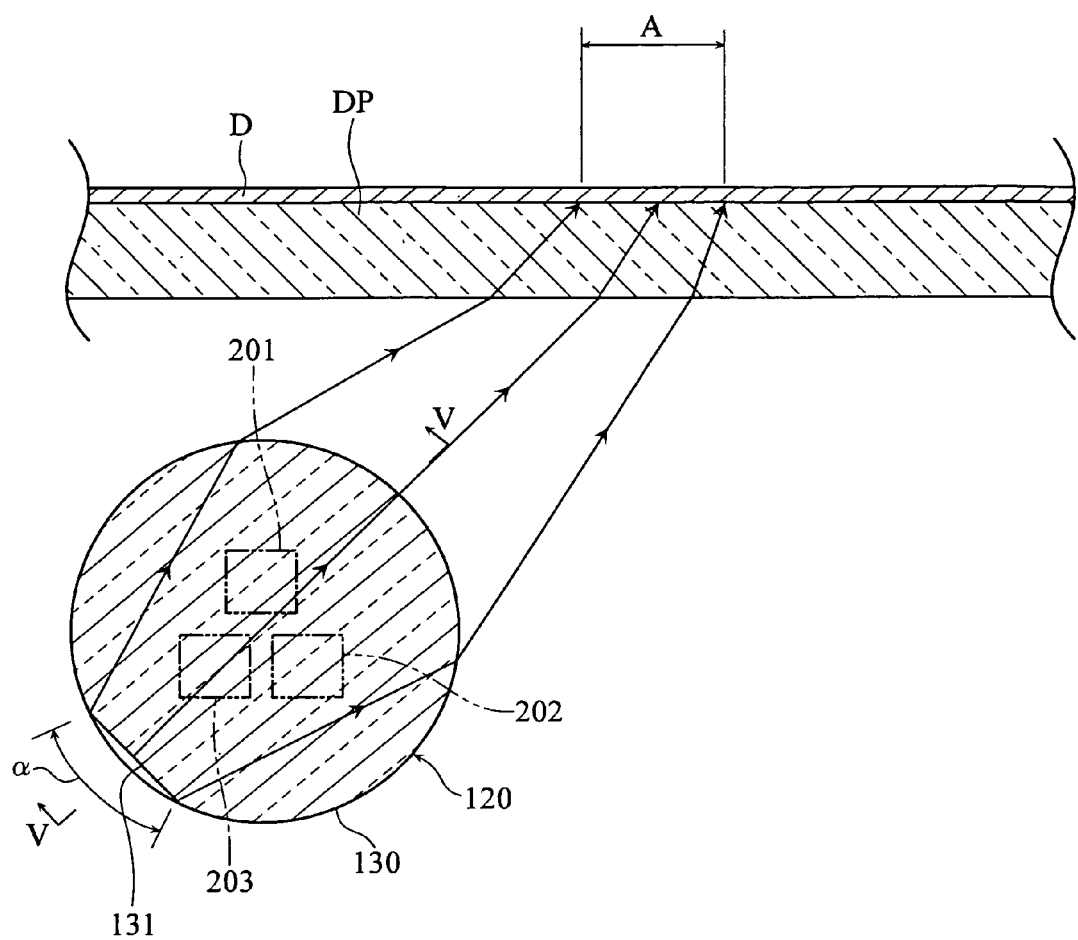
FIG. 4 is an enlarged sectional view taken along lines IV-IV in FIG. 2.
Figure 5:
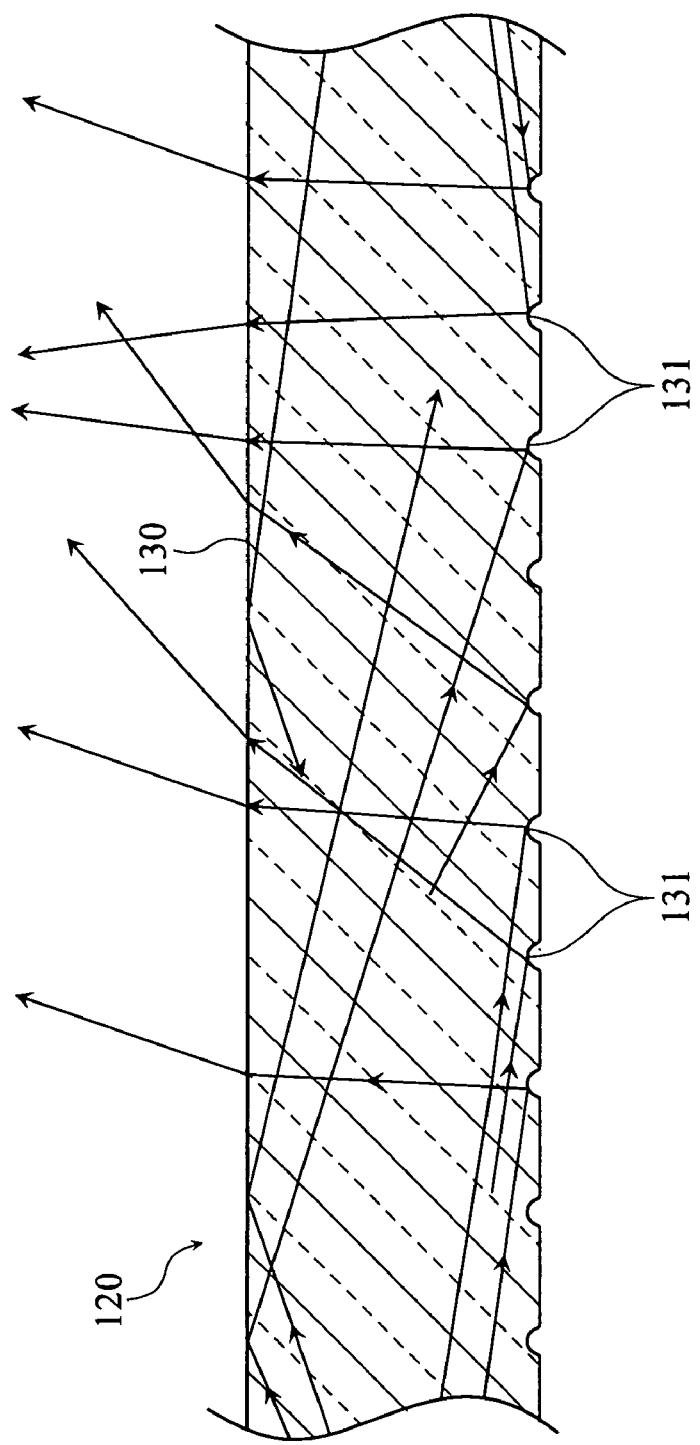
FIG. 5 is a sectional view taken along lines V-V in FIG. 4.

As will be understood from FIGS. 4 and 5, the main body 130 is formed, at a predetermined surface region in the circumferential direction, with a plurality of recesses 131. The recesses are spaced from each other in the longitudinal direction of the main body. As shown in FIGS. 2, 4 and 5, each of the recesses 131 extends in a direction crossing the main body 130 and has a generally arcuate inner surface. Specifically, for instance, the recess may be in the form of a groove whose inner surface is in the form of an arc having a radius of about 0.3 mm and which has a maximum depth of about 0.15 mm. The ends of each recess 131 are also radiused. Preferably, in the main body 130, each recess 131 is formed within an angular range α (see FIG. 4) of 3 to 45°, and more preferably, 5 to 30° in the circumferential direction. The interval between adjacent recesses 131 is determined in view of the distribution of the amount of light emitted from the main body 130, which will be described later.

As shown in FIG. 2, the first end 121 and the second end 122 of the light guide member 120 are integrally formed with angular socket portions 140. The respective bottom surfaces of the angular socket portions 140 substantially constitute the end surfaces 141 of the main body 130. Each end surface 141 serves as a light incident portion through which the light from the LED element 200 enters the main body 130. Preferably, the outer surface of the socket portion 140 is covered with a light-impermeable layer 142 which may comprise white paint or a metal film so that the light is prevented from leaking.

Figure 3:
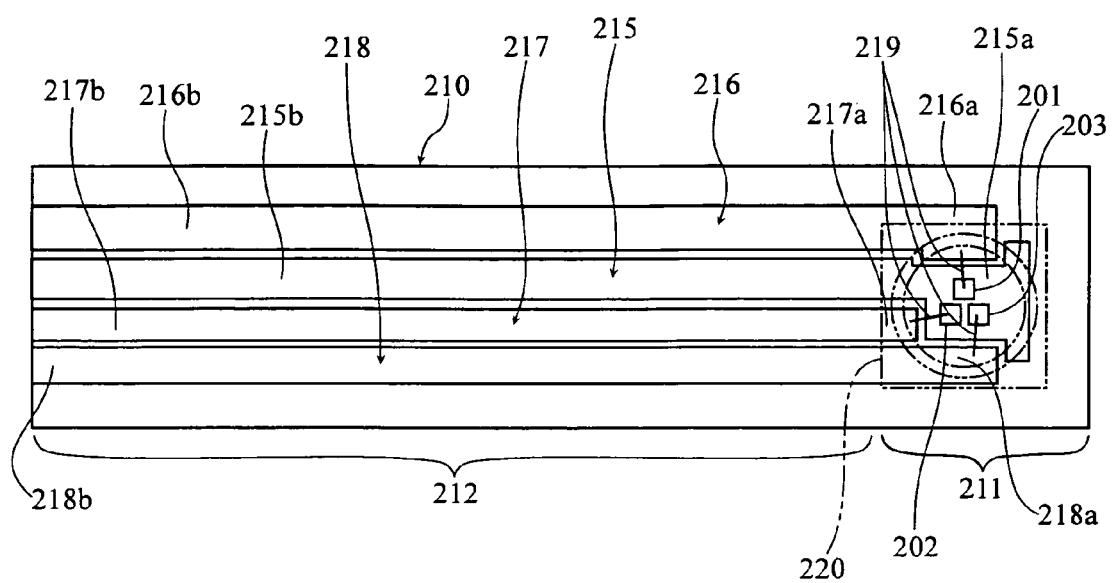
FIG. 3 is an enlarged plan view of the substrate as viewed in the direction of III-III arrows in FIG. 2.

The LED element 200 comprises three LED bare chips 201, 202 and 203 for red (R), green (G) and blue (B) (hereinafter simply referred to as LED chips) which are mounted on a substrate 210. The LED chips are so arranged on the substrate that the respective centers form the vertices of a triangle (see FIG. 3). The size of each LED chip 201, 202, 203 is about 0.3 mm×0.3 mm in plan view. The thickness of the LED chip is also about 0.3 mm. As shown in FIG. 3, the substrate 210 has an elongated rectangular shape. The substrate 210 is made of aluminum nitride, which has an extremely high thermal conductivity. An LED element mount region 211 is formed at one of longitudinally opposite ends of the substrate 210. The three LED chips 201, 202 and 203 are mounted on the LED element mount region 211. The portions of the substrate 210 other than the LED element mount region 211 constitute a heat dissipation region 212.

Specifically, as shown in FIG. 3, the substrate is formed with a common electrode pattern 215. An end 215a of the common electrode pattern is arranged on the LED element mount region 211 to serve as a chip bonding pad. The LED chips 201, 202 and 203 for R, G and B are bonded on the chip bonding pad 215a to be close to each other. The substrate is further formed with individual power supply electrode patterns 216, 217 and 218 corresponding to the LED chips 201, 202 and 203. Respective one ends 216a, 217a and 218a of the individual electrode patterns are arranged adjacent to the chip bonding pad 215a. The ends 216a, 217a and 218a are connected to the LED chips 201, 202 and 203, respectively, via bonding wires 219. With this arrangement, the amount of light emitted from each of the LED chips 201, 202 and 203 can be individually controlled by controlling the amount of current supplied to each LED chip. Thus, the control of the white light to be emitted from the light guide member 120 is easily performed. The other ends 215b, 216b, 217b, 218b of the common electrode pattern 215 and the individual power supply electrode patterns 216, 217, 218 extend on the heat dissipation region 212 of the substrate 210 in parallel with each other in the longitudinal direction. In this way, the heat dissipation region 212 of the substrate 210 is utilized for arranging the wiring pattern. Preferably, the electrode patterns 215, 216, 217 and 218 are formed by printing and baking silver paste. As a result, the surfaces of the chip bonding pad 215a and the ends 216a, 217a, 218a have a high reflectivity, and these terminal portions have a large current capacity.

A reflector 220 in the form of a frame is bonded, with e.g. an adhesive, to the LED element mount region 211 of the substrate 210 to surround the three LED chips 201, 202, 203 and the bonding wires 219. As shown in FIGS. 2 and 3, the reflector 220 has a quadrangular configuration as viewed in plan and has a predetermined thickness. The inner surface of the frame-shaped reflector 220 comprises a reflecting surface 221 which is tapered as progressing from the upper side (opening side, i.e., right side in FIG. 2). Preferably, the reflector 220 is formed by molding white or generally white resin. The outer dimension of the reflector 220 is set to correspond to the inner dimension of the socket portion 140 at the end of the light guide member 120. By fitting the reflector 220 into the socket portion 140 and appropriately performing bonding, the substrate 210 on which the LED chips 201, 202 and 203 are mounted and the light guide member 120 are integrally connected to each other. In this state, the LED chips 201, 202 and 203 mounted close to each other at the LED element mount region 211 do not project outward relative to the end surface of the main body 130 of the light guide member 120 which has a diameter of about 3 mm as described above, but rather face the substantial center of the end (see FIG. 4). The inner space of the frame-shaped reflector 220 mounted to the substrate 210 is filled with a protective resin 222 such as transparent silicone resin to seal the LED chips 201, 202, 203 and the bonding wires 219. To make the inner surface or upper surface (surface on the opening side) of the reflector 220 be a highly reflective surface, a metal film may be formed, by vapor deposition of e.g. aluminum, on the inner or upper surface of the reflective member made of resin.

The advantages of the linear light source device 100 will be described below.

When the three LED chips 201, 202 and 203 are turned on at each of the two ends 121 and 122 of the light guide member 120, light of the three colors impinges on the end surface 141 of the main body 130 of the light guide member 120 (see FIG. 2). In this process, the light emitted from the top surfaces of the LED chips 201, 202 and 203 directly impinges on the end surface 141 of the main body 130. The light emitted from the side surfaces of the LED chips 201, 202 and 203 is reflected by the reflecting surface 221 of the reflector 220 to impinge on the end surface 141 of the main body 130. Further, since the LED chips 201, 202 and 203 are mounted on the common electrode pattern 215 formed by printing and baking silver paste having a high reflectivity, the light traveling toward the substrate 210 is also reflected by the surface of the common electrode pattern 215 to impinge on the end surface 141 of the main body 130. As noted before, the reflector 220 is fitted in the angular socket portion 140 integrally formed on the light guide member 120 and covered with the light-impermeable layer 142 comprising white paint or a metal film. With this arrangement, light does not leak to the outside through the socket portion 140. Thus, the light emitted from the LED chips 201, 202 and 203 is efficiently introduced into the light guide member 120.

As schematically shown in FIG. 2, the light introduced into the light guide member 120 from the first and the second ends 121 and 122 travels through the main body 130 in the longitudinal direction while being totally reflected by the smooth surfaces. As schematically shown in FIG. 5, part of the light is reflected by the recesses 131 to change its travel direction to a direction crossing the main body 130. As schematically shown in FIG. 4, the light rays whose travel direction has been changed generally travel toward a region of the circumferential surface of the main body 130 which faces the recess 131. Of these light rays, those which impinge on the region of the circumferential surface of the main body 130 at an angle smaller than the total reflection critical angle is emitted to the outside. As noted before, in the main body 130, each recess 131 is formed within a limited central angular range of 3 to 45°, and more preferably, 5 to 30° in the circumferential direction. Further, the main body 130 has the convex lens effect due to the columnar shape. With these features, the light emitted is prevented from spreading in the circumferential direction of the main body 130 and reliably converged onto the target region A (see FIG. 4) of a predetermined width.

The recesses 131 are provided throughout the entire length of the main body 130. Thus, the above-described optical effect is obtained at any portion in the longitudinal direction of the main body 130. As a result, white light obtained by mixing red light, green light and blue light is reliably emitted from a predetermined circumferential region of the main body 130 throughout the entire length toward the target region A.

In the linear light source device 100 having the above-described structure, light emitted from the LED chips 201, 202 and 203 provided at each end is guided in the longitudinal direction of the light guide member 120. Thus, the amount of light in the light guide member decreases as progressing toward the center of the length. However, the light emission amount distribution of the light guide member 120 in the longitudinal direction can be adjusted by varying the intervals or depths of the recesses 131 of the main body 130 with respect to the longitudinal direction. For instance, the intervals between adjacent recesses 131 may be set to become smaller as progressing from each end toward the center of the main body 130. In this case, the possibility that the light, which has traveled in the longitudinal direction, is guided to travel in a direction crossing the main body 130 is larger at a portion closer to the center. Thus, a reduction in the amount of light at the center of the main body 130 in the longitudinal direction is compensated, so that the amount of light emission becomes uniform throughout the length of the main body 130. The same effect is obtained also when the depths of the recess 131 are so set to become larger as progressing from each end toward the center of the main body 130.

In the linear light source device 100 having the above-described structure, the three LED chips 201, 202 and 203 at each end of the light guide member 120 are arranged closer to each other on the substrate 210. With this arrangement, red light, green light and blue light are mixed uniformly to travel in the light guide member 120. As a result, uniform white light is emitted from every portion of the light guide member 120 in the longitudinal direction.

Further, in the linear light source device 100 having the above-described structure, aluminum nitride is particularly employed as the material of the substrate 210, and LED chips 201, 202 and 203 are directly bonded to the substrate 210. Generally, an LED chip is likely to be deteriorated due to heat. Specifically, while an LED chip emits light corresponding to the applied current, it also generates heat corresponding to the current. Generally, therefore, to avoid the shortening of life due to heat, the current to be applied is set relatively low. Specifically, when an LED chip is to be used for a resin package type LED lamp or mounted on a substrate made of glass-fiber-reinforced epoxy resin or alumina ceramic material, the normal current to be applied is set to about 20 mA at the most. In the linear light source device 100, however, since the LED chips 201, 202 and 203 are directly bonded to the substrate 210 made of aluminum nitride which has an extremely high thermal conductivity of e.g. 200 W/m·K, the heat generated at the LED chips is immediately dissipated to the substrate 210 even when a large amount of current is applied to the LED chips 201, 202 and 203. Thus, while keeping a large light emission amount, the temperature rise and the resulting deterioration of the LED chips 201, 202 and 203 are prevented.

In the linear light source device 100, the LED element mount region 211 is provided at one of longitudinally opposite ends of the substrate 210, and the heat dissipation region 212 is provided integrally with the LED element mount region. This structure is advantageous for enhancing the above-described heat dissipation effect. To further enhance the heat dissipation effect, a heat dissipation fin (not shown) made of e.g. aluminum may be provided at the heat dissipation region 212 of the substrate 210 or the heat dissipation region 212 may be held in contact with a metal housing of an apparatus incorporating the linear light source device 100.

As an experiment, electrode patterns 215-218 made of silver paste and having a thickness of 10 μm were formed on a substrate 210 made of aluminum nitride and having a width of 5.0 mm, a length of 18.0 mm and a thickness of 0.6 mm. LED chips 201, 202 and 203 for R, G and B each having a size of about 0.22 mm×0.29 mm×0.29 mm and rated current of 20 mA were mounted on the substrate to be close to each other, as shown in FIG. 3. The LED chips 201, 202 and 203 were continuously lit for 150 hours by applying current of 50 mA. After the lapse of 150 hours, the reduction in the amount of light was measured and found to be not more than 10%. It is to be noted that the period of 150 hours is so set that an image reader incorporating the linear light source device 100 as the light source can read about fifty thousands sheets of document provided that the reading of one sheet of document takes about ten seconds.

As an comparative example, the substrate 210 was replaced with one made of glass-fiber-reinforced epoxy resin, and the LED chips 201, 202 and 203 were continuously lit for 150 hours by applying current of 50 mA. The reduction in the amount of light after the lapse of 150 hours was found to be over 20%, so that the practical use of this light source device was found to be impossible.

Figure 6:
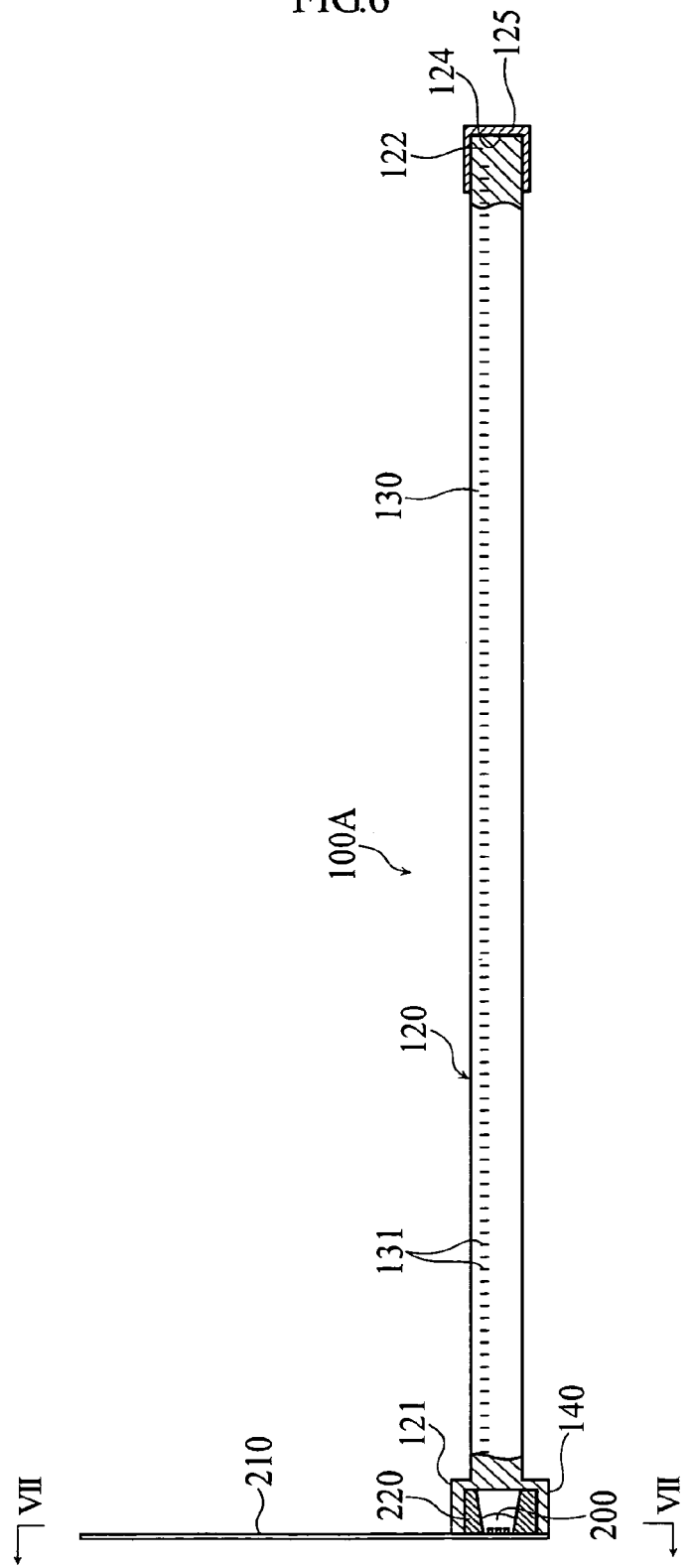
FIG. 6 is a front view, partially in section, showing the overall structure of a linear light source device according to a second embodiment of the present invention.
Figure 7:
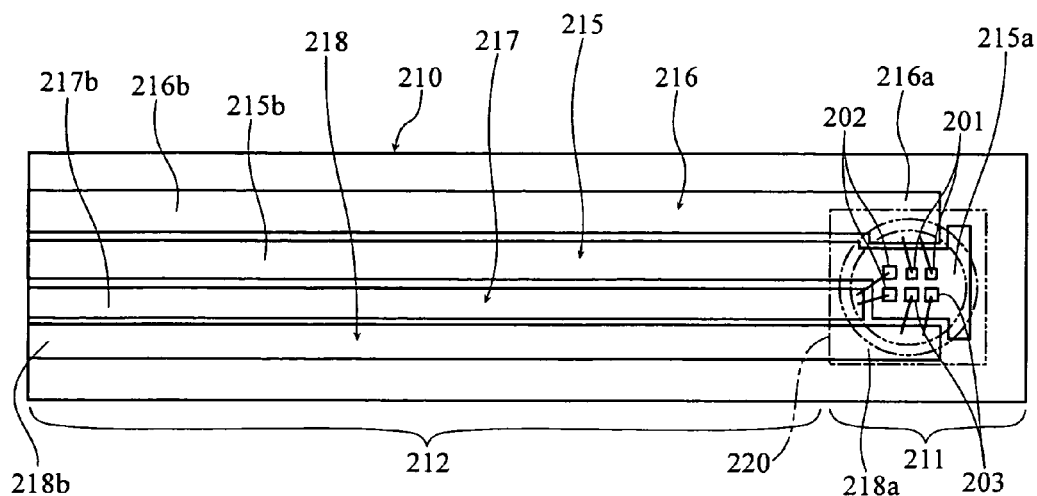
FIG. 7 shows the device as viewed in the direction of VII-VII arrows in FIG. 6.

FIGS. 6 and 7 show a linear light source device according to a second embodiment of the present invention. In the linear light source device 100A of the second embodiment, an LED element 200 is provided at an end 121 (first end) of the light guide member 120, whereas a reflecting surface 124 is provided at another end 122 (second end) of the light guide member. In this point, the linear light source device 100A differs from the linear light source device 100 of the first embodiment shown in FIGS. 1-5. Only the elements of the linear light source device 100A which differ from those of the linear light source device 100 will be described below. The elements which are identical or similar to those of the linear light source device 100 of the first embodiment are designated by the same reference signs as those used for the first embodiment, and the description thereof will be omitted.

In the light guide member 120, only the first end 121 is provided with a socket portion 140. The second end 122 is formed with the reflecting surface 124. The structure of the main body 130 and the socket portion 140 is basically the same as that of the first embodiment. The reflecting surface 124 may be provided by fitting a cap 125 made of white or generally white resin to the second end 122 of the light guide member 120 or forming a metal film by vapor deposition. Preferably, the reflecting surface 124 is capable of reflecting 100 percent of the light rays traveling in the main body 130 toward the second end 122.

Similarly to the first embodiment, at the first end 121 of the main body 130, a plurality of LED chips 201, 202, 203 mounted on a substrate 210 are arranged. In the second embodiment, as shown in FIG. 7, six LED chips made up of two LED chips 201 for red (R), two LED chips 202 for green (G) and two LED chips 203 for blue (B) are arranged close to each other on the chip bonding pad 215a of the common electrode pattern 215 so that two lines each consisting of three chips are formed. The LED chips 201, 202 and 203 are connected to the ends 216a, 217a and 218a of the individual power supply electrode patterns 216, 217 and 218 for respective colors via bonding wires 219. With this arrangement, a large amount of light is introduced from the first end 121 into the main body 130 of the light guide member 120. Thus, although the LED chips 201, 202 and 203 are provided only at the first end 121 of the light guide member 120, a sufficient amount of light travels through the entire length of the light guide member 120.

The light emitted from the LED chips 201, 202 and 203 is introduced into the main body 130 without loss by the action of the reflector 220 and the electrode pattern 215 having a high reflectivity due to the use of silver paste as the material and then travels within the main body 130. The light rays traveling in this way or the light rays reflected by the reflecting surface 124 at the second end 122 of the light guide member 120 to travel in the reverse direction are reflected by the plurality of recesses 131 provided throughout the length of the main body 130. The light rays reflected by the recesses 131 travel toward the opposite side of the recesses 131 to be emitted to the outside. Thus, similarly to the first embodiment (see FIG. 4), white light obtained by mixing red light, green light and blue light is reliably emitted from a predetermined circumferential surface region of the main body 130 toward the target region throughout the entire length of the main body 130. Since the LED chips 201, 202 and 203 are provided only at the first end 121 of the light guide member 120 in the second embodiment, the uniformity of the mixing ratio of red light, green light and blue light in the longitudinal direction of the light guide member 120 is further enhanced. As a result, white light of a uniform tone is emitted from the overall length of the light guide member.

Figure 8:
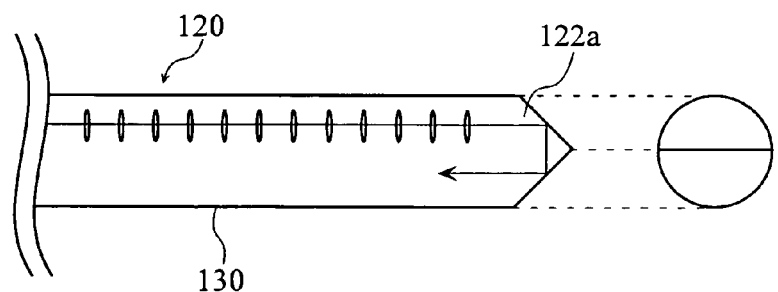
FIG. 8 is an enlarged view showing a variation of the end of a linear light source device according to the second embodiment of the present invention.
Figure 9:
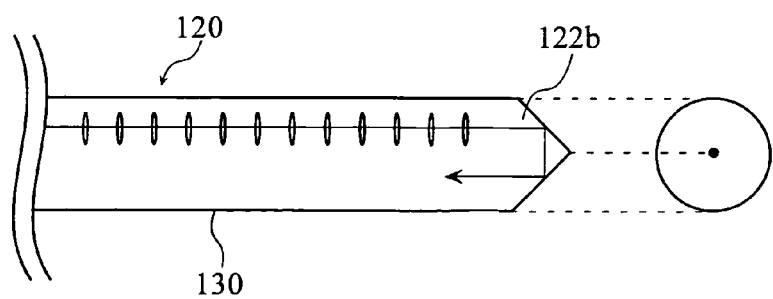
FIG. 9 is an enlarged view showing another variation of the end of a linear light source device according to the second embodiment of the present invention.
Figure 10:
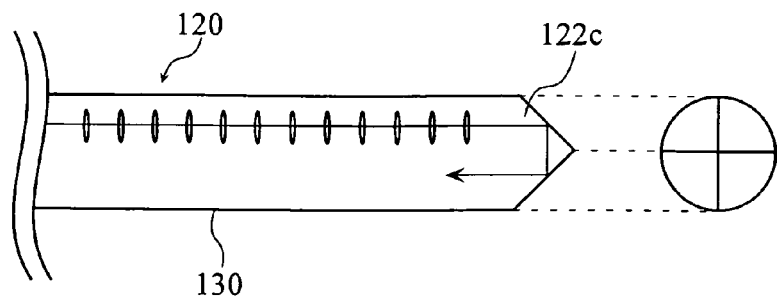
FIG. 10 is an enlarged view showing still another variation of the end of a linear light source device according to the second embodiment of the present invention.

The second end 122 of the light guide member 120 according to the second embodiment is not limited to the above-described structure. The second end may have another structure as long as it efficiently reflects the light traveling in the main body 130. For instance, the second end 122a as shown in FIG. 8 may be employed which comprises two reflecting surfaces inclined substantially 45 degrees with respect to the axis of the main body 130 and is triangular in section. With this arrangement, most part of the light traveling in the main body 130 in the axial direction is totally reflected twice by the two reflecting surfaces to travel in the reverse direction. This is because only little part of the light impinges on each reflecting surface at an angle smaller than the total reflection critical angle. With this arrangement, almost the same advantages as those of the second end 122 of the second embodiment are obtained. Further, since the second end 122a is provided just by configuring the reflecting surfaces, the manufacturing process is simplified. To further enhance the light reflection efficiency, a cap made of white or generally white resin may be fitted to the second end 122a or a metal film may be formed by vapor deposition. Alternatively, the second end 122b as shown in FIG. 9 may be employed which is in the form of a cone having a generatrix inclined substantially 45 degrees with respect to the axis of the main body 130. Alternatively, the second end 122c as shown in FIG. 10 may be employed which is in the form of a pyramid including ridge lines inclined substantially 45 degrees with respect to the axis of the main body 130. With these arrangements again, the same advantages as described above are obtained.

Figure 18A:
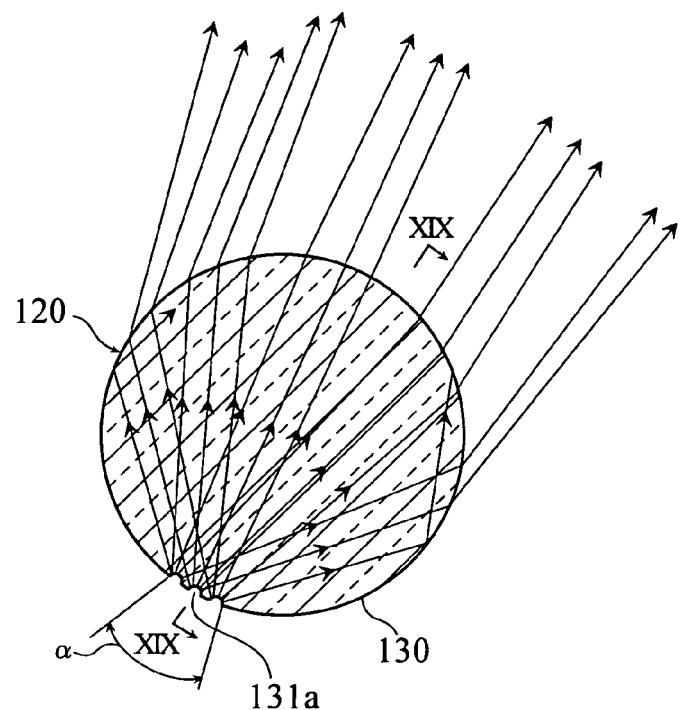
FIG. 18A is a sectional view showing a variation of the recess to be formed on the main body of a light guide member.
Figure 18B:
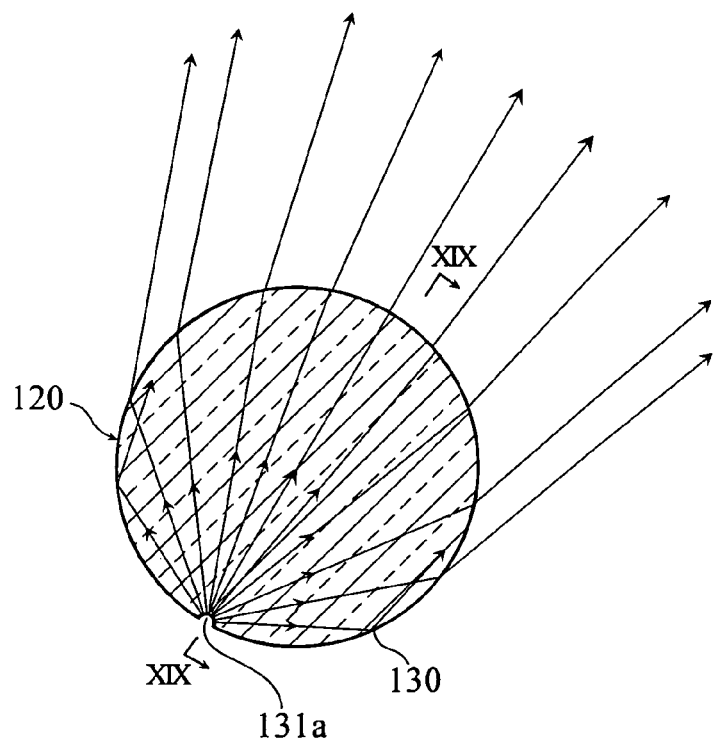
FIG. 18B is a sectional view showing a variation of the recess to be formed on the main body of a light guide member.
Figure 19:
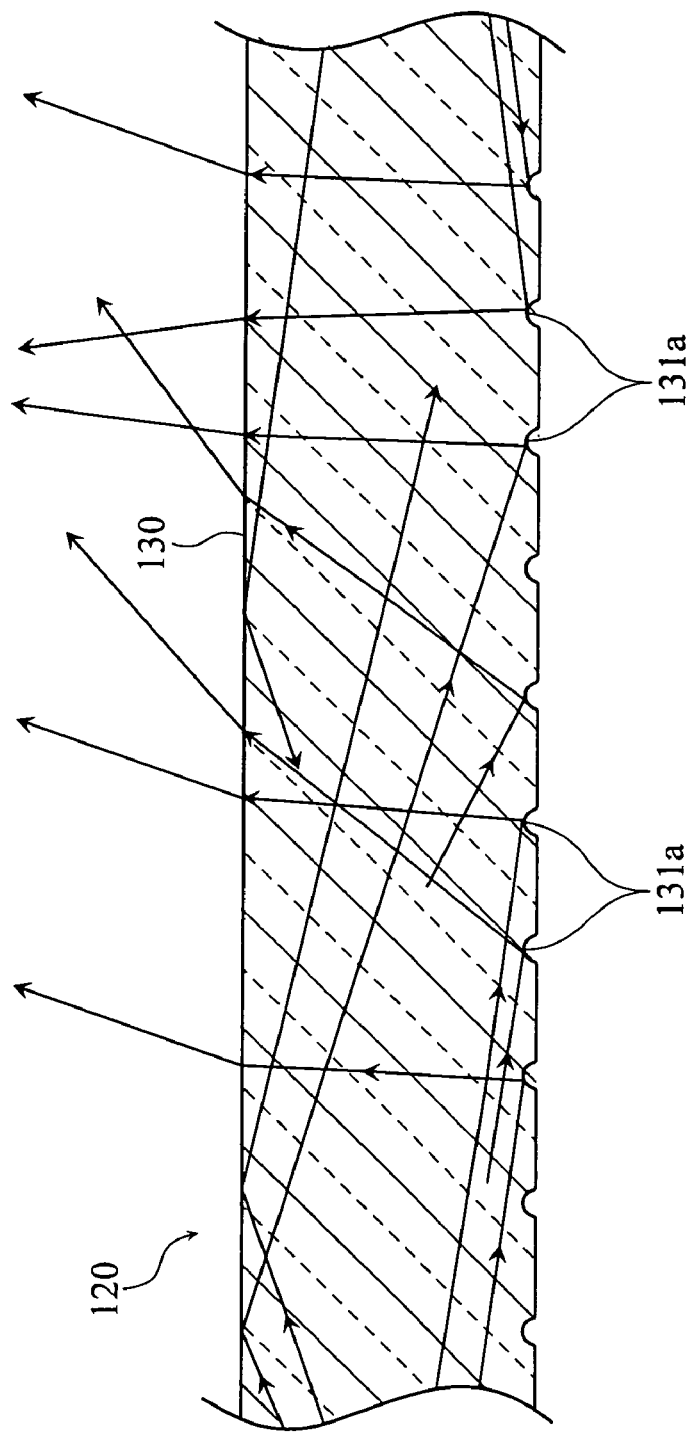
FIG. 19 is a sectional view taken along lines XIX-XIX in FIGS. 18A and 18B.

In the linear light source devices 100 and 100A of the first and the second embodiments, each of the recesses 131 formed on the main body 130 of the light guide member 120 comprises a groove elongated in a direction crossing the longitudinal axis of the circumferential surface of the main body 130 and including an arcuate inner surface. Unlike this, however, the recesses 131a as shown in FIGS. 18A, 18B and 19 may be employed each of which has a spherical inner surface. In this case, a plurality of recesses 131a may be arranged within a predetermined angular range α in the circumferential direction of the main body 130 as shown in FIG. 18A or a single recess 131a may be arranged at a predetermined portion in the circumferential direction of the main body 130. In both of the structures shown in FIGS. 18A and 18B, the recesses 131a are arranged at predetermined intervals in the longitudinal direction of the main body 130. Similarly to the foregoing embodiments, the amount of light emitted from each portion of the main body 130 in the longitudinal direction can be adjusted by varying the intervals of the recesses 131a or depths or size of the recesses with respect to the longitudinal direction of the main body 130. The recesses 131a having a spherical inner surface have an advantage that the manufacturing of a mold for forming the recesses 131a is relatively easy.

Figure 11:
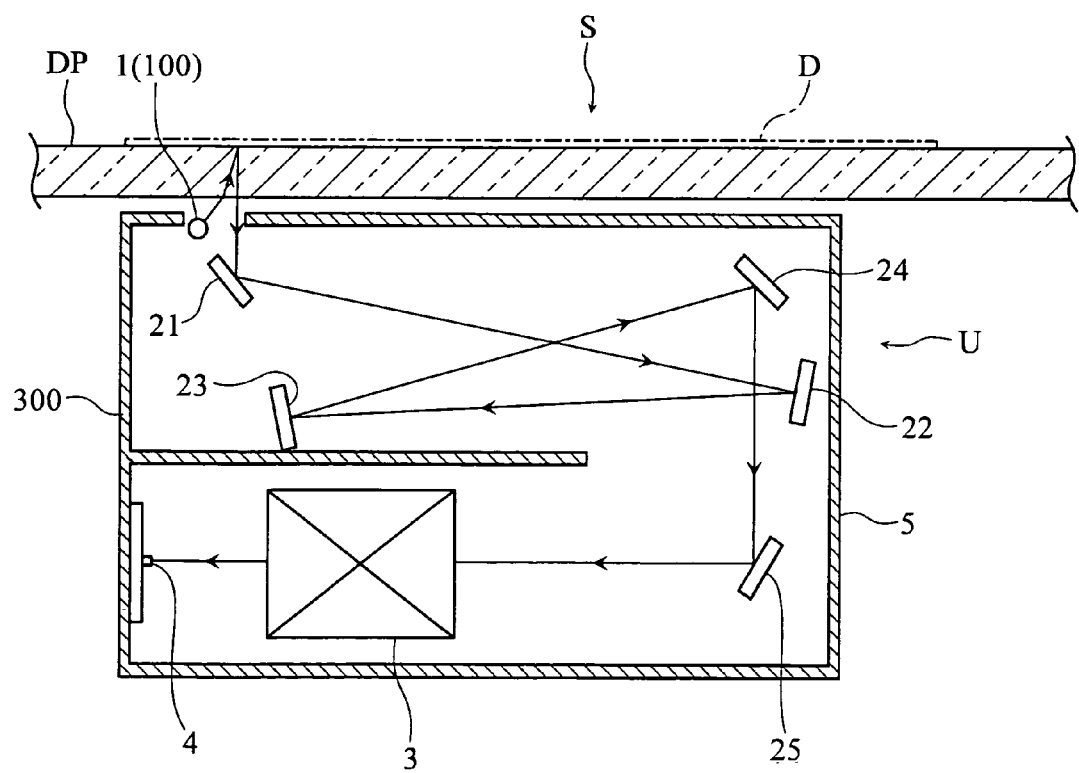
FIG. 11 is a schematic view showing the overall structure of an image reader using the linear light source device shown in FIG. 1 or FIG. 6.

The above-described linear light source device 100, 100A can suitably replace a conventional cold-cathode tube as the illumination light source of an image reader 300 such as a CCD image sensor unit. As shown in FIG. 11, the image reader 300 comprises the linear light source device 100, a plurality of mirrors 21-25, a lens 3 and a CCD line sensor 4 which are housed in a case 5. In a flat-bed image scanner S, the image reader 300 is moved in the secondary scanning direction below a document table DP made of e.g. transparent glass. In operation, the light emitted from the linear light source device 100 and reflected by the document D is reflected by the mirrors 21-25 to converge on the CCD line sensor 4 via the lens 3. Thus, the image of one line of the document D extending in the primary scanning direction is formed on the CCD line sensor 4 and read. This operation is repeated every time the image reader 300 is moved in the secondary scanning direction by a predetermined pitch, whereby the two dimensional image of the document is read.

As noted before, in the linear light source device 100 according to the present invention, the light emitting portion, i.e., the main body 130 of the light guide member 120 has a columnar shape. Thus, without largely changing the design, the linear light source device can be arranged in a portion of the image reader 300 in which a cold-cathode tube is formerly arranged. The linear light source device 100 efficiently emits light in a limited direction from a circumferential surface region of the main body 130 which is opposite from the region where the recesses 131 are formed (see FIG. 4). Thus, in the flat-bed image scanner S, the light emission direction is oriented toward a predetermined region in the secondary scanning direction of the document D on the document plate DP. In this way, unlike the cold-cathode tube which emits light from the entire circumferential surface, the linear light source device 100 according to the present invention emits light in a limited direction throughout the length without the need for adding a reflective member.

Figure 12:
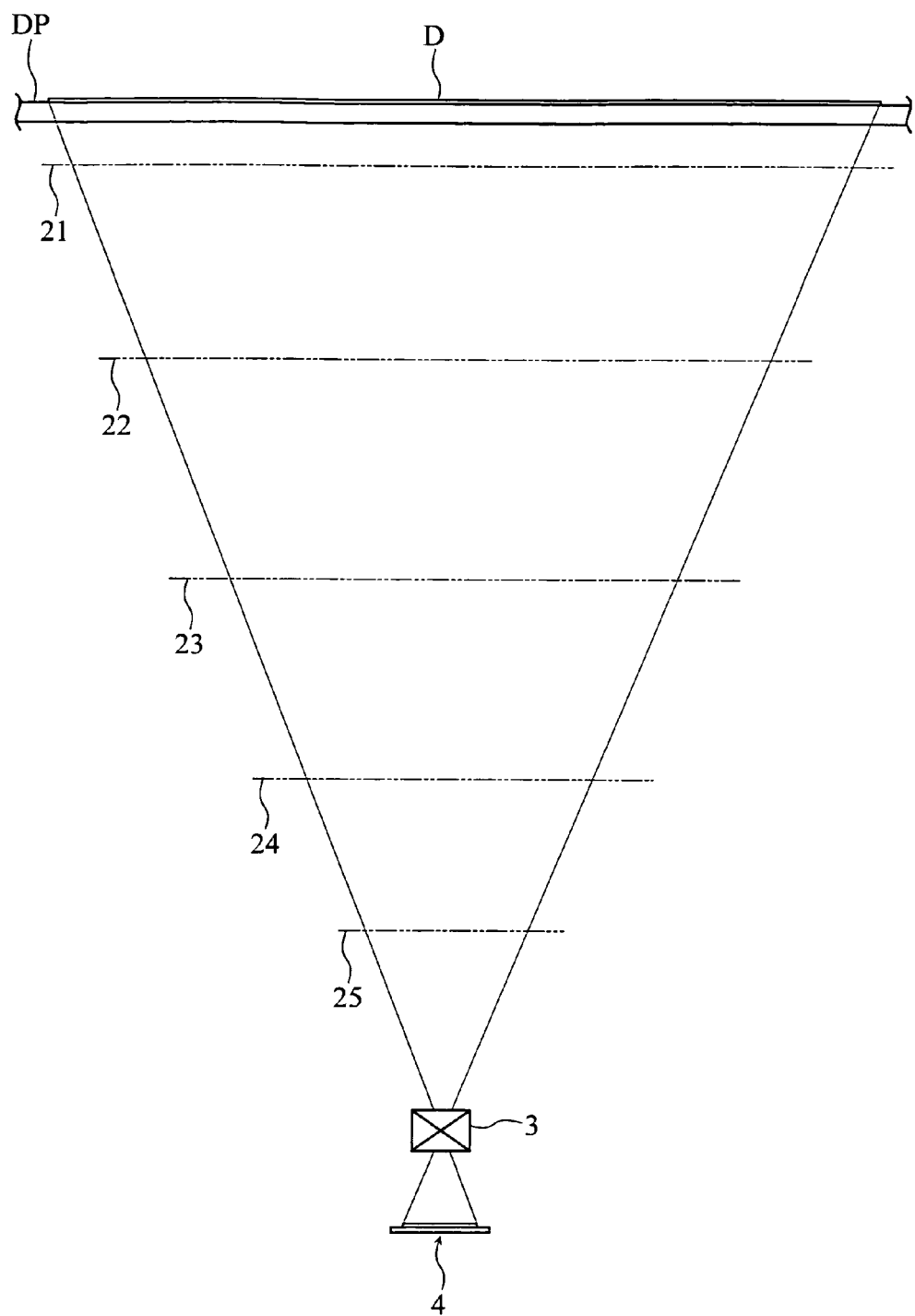
FIG. 12 schematically illustrates the light path from the document to the CCD line sensor in the image reader shown in FIG. 11.

FIG. 12 schematically shows the light path in the CCD image sensor unit U in the developed state. Specifically, the figure shows the light path from the document D to the CCD line sensor 4 through the lens 3 and the reflection by the mirrors 21-25. As will be understood from the figure, the reading range of the document D is so wide that the angle of view as viewed from the CCD line sensor 4 and the lens 3 is about 50°, for example. Thus, the light path from each end of the reading range to the CCD line sensor 4 is considerably longer than that from the center of the reading range to the CCD line sensor 4. As a result, even when the document is illuminated with light of uniform brightness throughout the reading range, the image read at the CCD line sensor 4 is dark at the ends of the reading range.

Although the brightness can be made substantially uniform in the primary scanning direction by correcting the image reading signals at the CCD line sensor 4, such correction requires a complicated correction circuit. In the linear light source device 100 according to the present invention, however, by setting the amount of light to be emitted from each end of the light guide member 120 in the longitudinal direction (i.e., primary scanning direction) larger than that from the center of the light guide member, it is possible to illuminate the two ends of the reading range of the document D to be brighter than the center of the reading range. As a result, the brightness of the image read at the CCD line sensor 4 is made uniform in the primary scanning direction without using a correction circuit.

The above-described uniform brightness is easily achieved by appropriately setting the intervals between adjacent recesses 131 or the depth of each recess 131 formed at the main body 130 of the light guide member 120 in view of the reduction of light amount in the light guide member which depends on the distance from the end of the light guide member 120.

The linear light source device 100 according to the present invention emits white light by turning on the LED elements for R, G and B simultaneously. Since the wavelength distribution of each color has a sharp peak, the color processing of the read color image is easy, and proper color image reproduction is possible.

Figure 13:
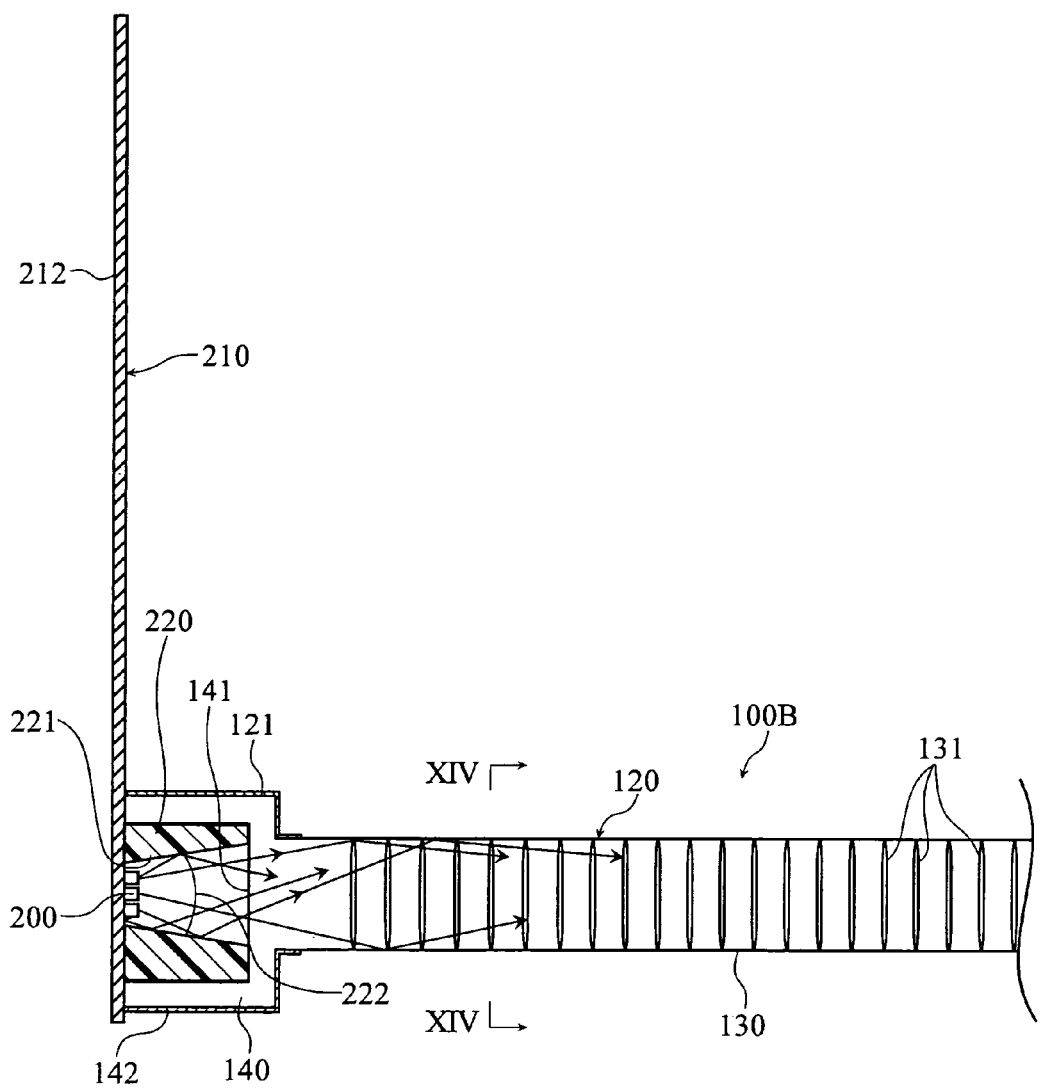
FIG. 13 is an enlarged view showing a principal portion of a linear light source device according to a third embodiment of the present invention.
Figure 14:
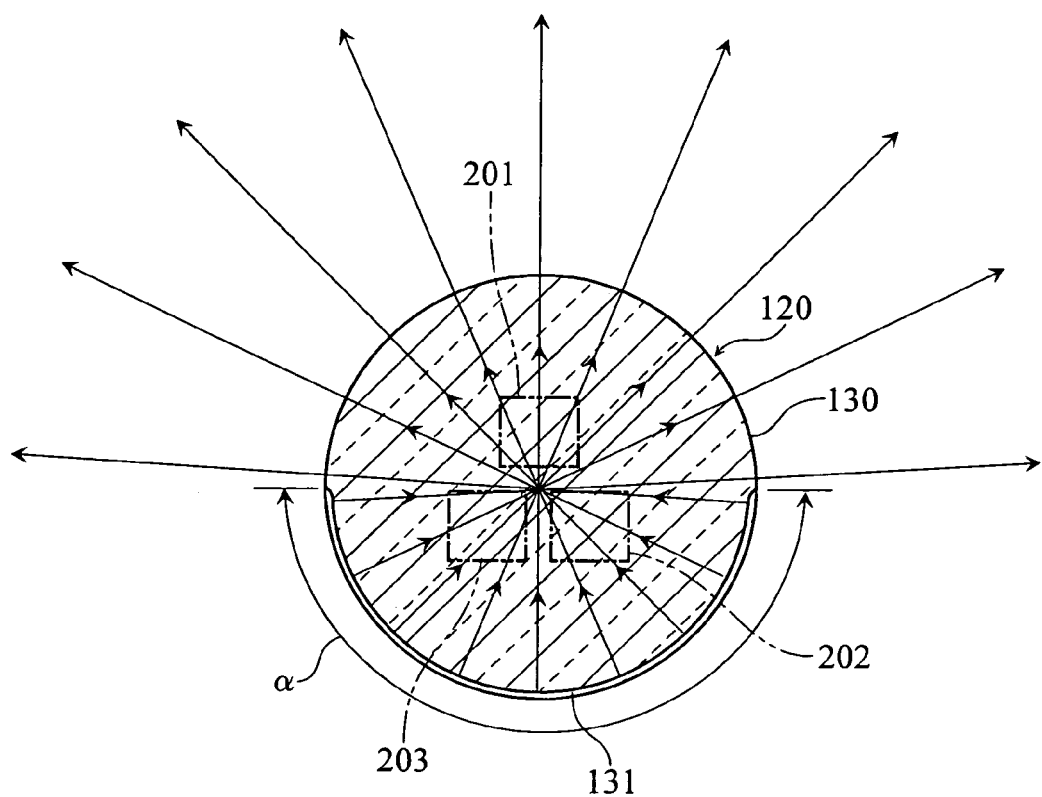
FIG. 14 is an enlarged sectional view taken along lines XIV-XIV in FIG. 13.

FIGS. 13 and 14 show a linear light source device according to a third embodiment of the present invention. Unlike the linear light source devices of the first embodiment (see FIGS. 1-5) and the second embodiment (see FIGS. 6 and 7), in the linear light source device 100B of the third embodiment, the recesses 131 formed on the circumferential surface of the main body 130 of the light guide member 120 to be spaced from each other in the longitudinal direction of the main body are arranged within an enlarged angular range α (see FIG. 14) of 120 to 270°, and more preferably, 120 to 200°. Since the structure of other elements or portions is the same as that of the foregoing embodiments, these elements or portions are designated by the same reference signs as those used for the foregoing embodiments, and the description thereof will be omitted. The outer diameter of the main body 130 may be made larger than those exemplarily described as the first and the second embodiments. Further, the number of each color of LED chips 201, 202, 203 to be arranged at an end of the light guide member 120 may be increased correspondingly. The LED chips 201, 202, 203 may be provided at both of the first end 121 and the second end 122 of the light guide member 120, similarly to the first embodiment shown in FIGS. 1-5. Alternatively, similarly to the second embodiment shown in FIGS. 6 and 7, the LED chips 201, 202, 203 may be provided only at one end (first end) 121 of the light guide member 120. When the LED chips 201, 202, 203 are provided only at the first end 121, the second end 122 of the light guide member 120 may be formed with a reflecting surface 124 similarly to the second embodiment shown in FIGS. 6 and 7 or may be configured like the end 122a, 122b or 122c of the variations of the second embodiment shown in FIGS. 8-10.

In this embodiment again, light traveling in the main body 130 in the longitudinal direction is reflected by each recess 131 to change its travel direction to a direction crossing the main body 130. In this process, as shown in FIG. 14, light is reflected at a wide central angular range to cross the main body 130 to be emitted to the outside. As a result, the light emitted from the main body 130 travels in a wide range (e.g. corresponding to the central angle of 120 to 200° of the main body 130). However, similarly to the first embodiment, little light leaks to the side provided with the recesses 131, and light is efficiently emitted to a predetermined range.

Figure 15:
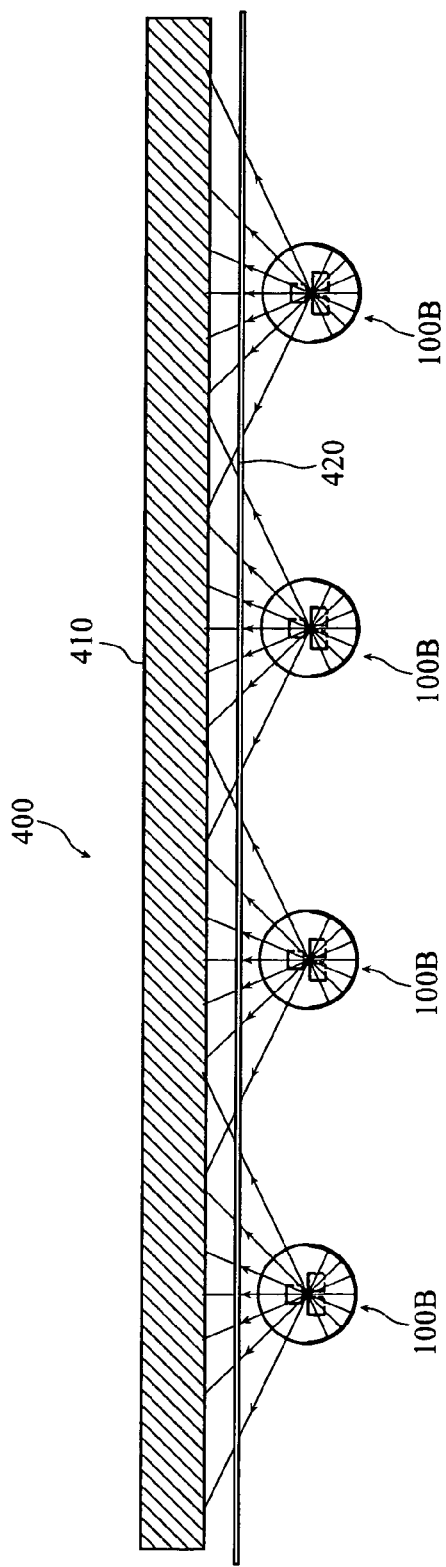
FIG. 15 is a schematic structural view of a flat display apparatus using the linear light source device shown in FIG. 13.

As shown in FIG. 15, a backlight (illuminator) of a flat display apparatus 400 such as a liquid crystal display apparatus can be provided by arranging a plurality of linear light source devices 100B of the third embodiment side by side. Specifically, the linear light source devices 100B are arranged at predetermined intervals on the rear side of a flat display panel 410 so that the light emitted from each main body 130 is directed toward the reverse surface of the flat-display panel 410.

As noted before, since the light emission range of the linear light source device 100B is relatively large, the light source device illuminates a region in the form of a wide strip, although it is a linear light source device. Thus, by arranging the plurality of light source devices side by side so that the strip-like regions are connected to each other, the flat display panel 410 is illuminated from behind with a uniform amount of light regardless of the size of the flat display panel. Preferably, in this case, a light diffusion sheet or a light diffusion panel 410 may be arranged between the reverse surface of the flat display panel 410 and the linear light source devices 100B. With this arrangement, the brightness recognized from the obverse surface side of the flat display panel 410 becomes more uniform.

Figure 16:
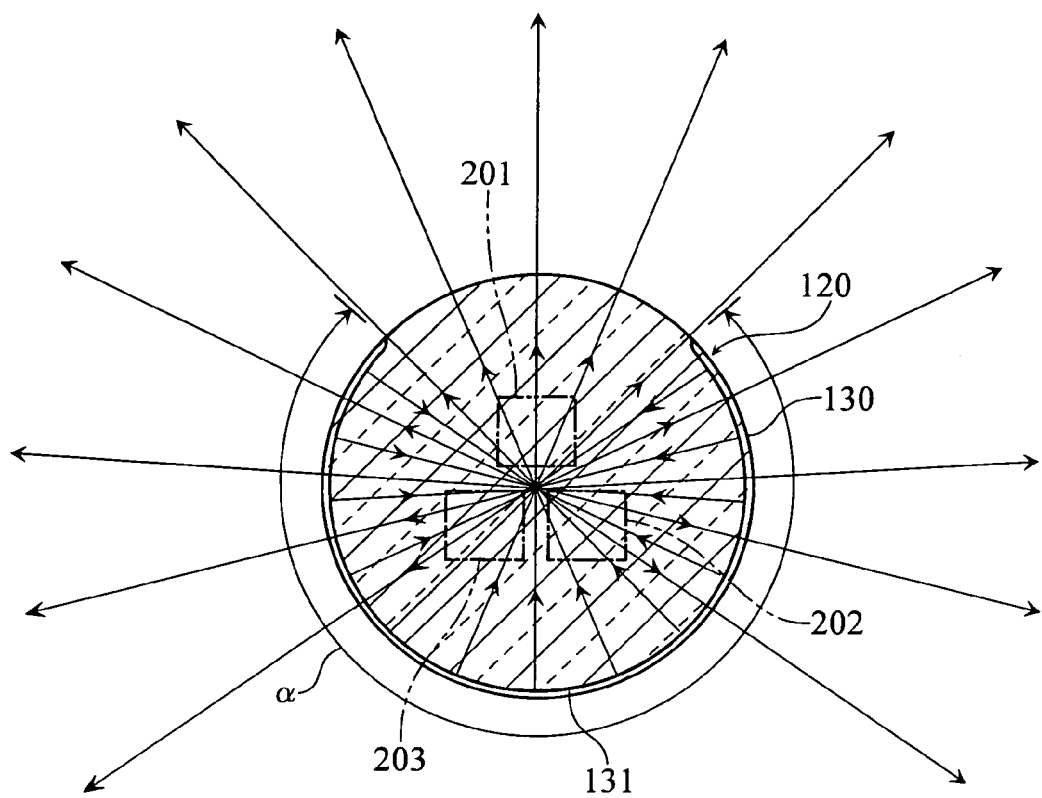
FIG. 16 is a view corresponding to FIG. 14, showing a variation of the linear light source device according to the third embodiment of the present invention.
Figure 17:
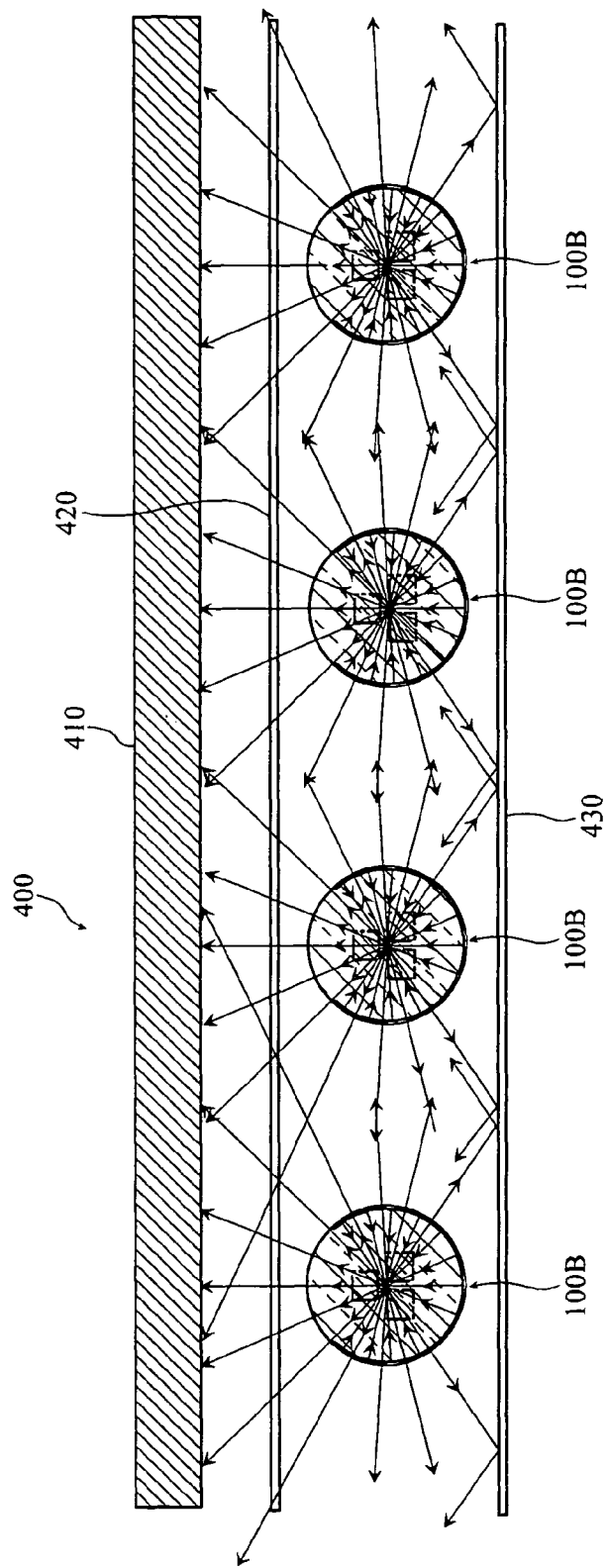
FIG. 17 is a schematic structural view of a flat display apparatus using the linear light source device shown in FIG. 16.

As shown in FIG. 16, when the range α in the circumferential direction in which the recesses 131 of the main body 130 of the light guide member 120 are formed is enlarged to 270°, light is emitted from each linear light source device 100B not only toward the reverse surface of the flat display panel 410 but also toward the side opposite from the flat display panel 410. In this case, as shown in FIG. 17, in addition to the light diffusion sheet or light diffusion panel 420, a light reflecting plate 430 including a white or mirror reflecting surface may be arranged on the rear side of the linear light source devices 100B. With this arrangement, the light emitted toward the rear side of the linear light source devices 100B is reflected toward the reverse surface of the flat display panel 410. As a result, the rear surface of the flat display panel 410 is illuminated with more uniform light.

Conventionally, a cold-cathode tube has been used as the backlight source of the above-described kind of flat display apparatus. The use of an illuminator incorporating the linear light source device 100B instead of a cold-cathode not only achieves power saving but also enables the color liquid crystal display to exhibit clear color, because the illumination is performed using white color obtained by mixing red light, green light and blue light each having a sharp wavelength distribution.

As the illumination light source of the flat display apparatus 400, instead of the linear light source devices 100B including a main body 130 shown in FIGS. 14 and 16, the linear light source devices 100 including a main body 130 shown in FIGS. 18A and 18B may be employed. The main body of this linear light source device includes recesses 131a having a spherical inner surface, so that the light reflected by the inner surface of each recess 131a diffuses. As a result, the light is emitted from the main body 131 in a diffusing manner. Thus, the reverse surface of the flat display panel 410 is illuminated with uniform light.

As described above, a linear light source device according to the present invention can suitably replace a conventional cold-cathode tube as the illumination light source of an image reader which uses a CCD line sensor. By using the linear light source device, the concern about environmental pollution due to mercury vapor is eliminated, and the necessity for a power supply circuit such as a booster inverter is also eliminated. Further, proper color controlling by the use of white light is possible, high light emission efficiency is achieved, and shortening of the life of an LED chip due to heat is prevented. Moreover, a linear light source device according to the present invention can properly constitute an illuminator as a backlight of a flat display apparatus.

The present invention is not limited to the foregoing embodiments, and all the variations within the scope of the following claims are intended to be included within the scope of the present invention.

In the foregoing embodiments, as the recesses to be formed on the main body 130 of the light guide member 120 throughout the length, recesses 131 are employed each of which is in the form of a groove extending in a direction crossing the longitudinal axis of the main body 130 and has a generally arcuate inner surface. Alternatively, recesses 131a are employed each of which has a spherical inner surface, as shown in FIGS. 18A, 18B and 19. However, the configuration of the recesses 131 is not limited to the foregoing embodiments, and recesses having other configurations may be employed. What is important is that the recesses 131 are formed within a predetermined angular range α in the circumferential direction of the main body 130 so that light is emitted from a limited region of the circumferential surface of the main body 130, and the amount of light to be emitted from each portion in the longitudinal direction of the main body 130 can be adjusted by adjusting the density of the recesses 131 in the longitudinal direction of the main body 130.

Although recesses 131 are provided in the foregoing embodiments, projections may be provided instead.

Figure 20:
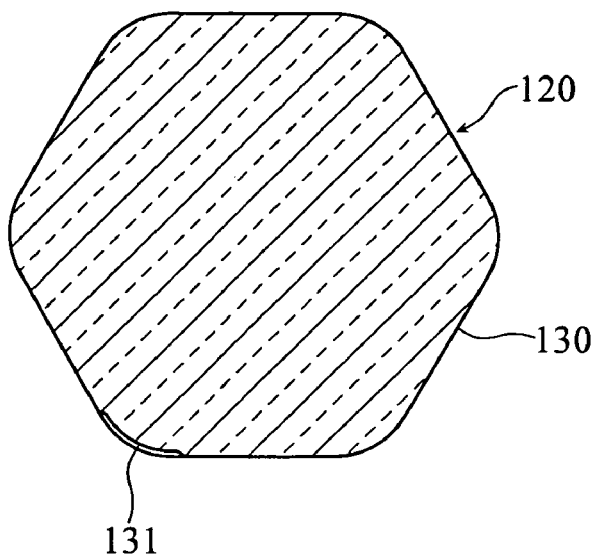
FIG. 20 is an enlarged sectional view showing a variation of the main body of a light guide member.
Figure 21:
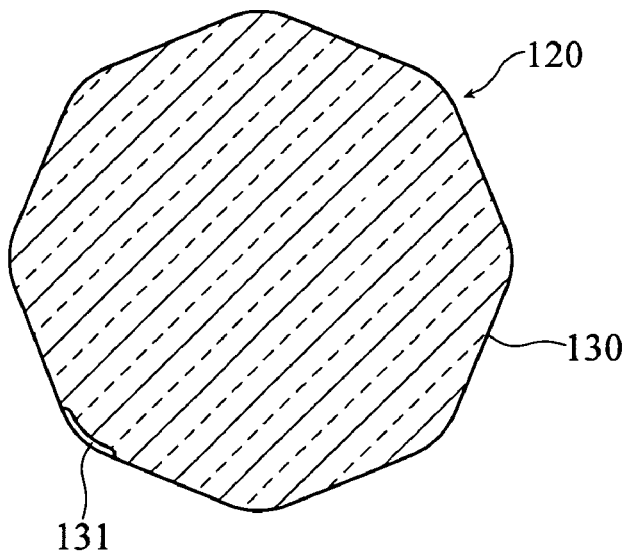
FIG. 21 is an enlarged sectional view showing another variation of the main body of a light guide member.
Figure 22:
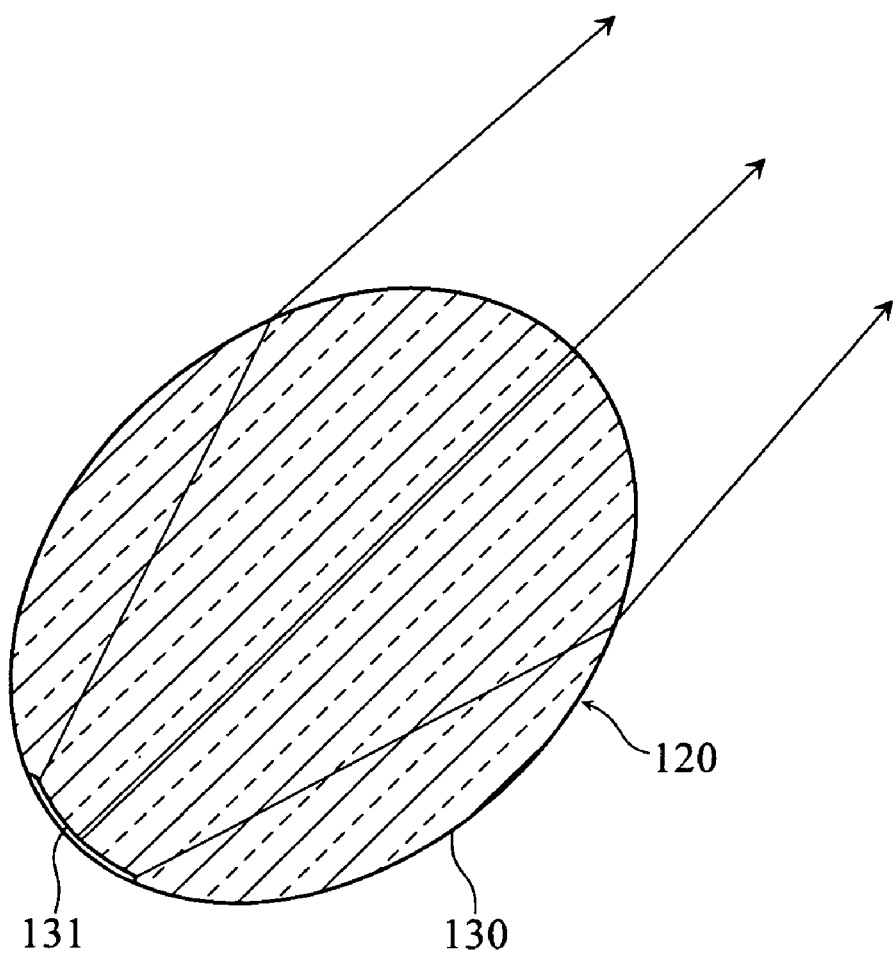
FIG. 22 is an enlarged sectional view showing still another variation of the main body of a light guide member.

Although the main body 130 of the light guide member 120 is columnar in the foregoing embodiments, the shape of the main body is not limited thereto. For instance, as shown in FIGS. 20 and 21, the main body may be in the form of a hexagonal prism or an octagonal prism. Preferably, in this case, the ridge lines of the prisms are rounded. Alternatively, as shown in FIG. 22, the main body may be in the form of a column having an oval cross section.

In the foregoing embodiments, the same number (one or two) of LED chips 201, 202, 203 for R, G, B are mounted on the LED element mount region 211 of the substrate 210. However, it is only necessary that at least a single LED chip for each color is mounted. At present, the amount of blue light emitted from the blue (B) LED is smaller than that of the LEDs of other colors. Thus, while mounting a single red LED chip (R) and a single green LED chip (G) two blue (B) LED chips may be mounted.

Although the LED chips 201, 202, 203 for R, G, B are mounted on the LED element mount region 211 in the foregoing embodiments, a white LED chip may be mounted instead. In this case, white light is emitted without the need for adjusting the amount of light from each color of LED chip, and only a single electrode pattern for power supply is necessary. Thus, the process steps and the parts for manufacturing the linear light source device are reduced, so that the manufacturing cost is reduced. The white LED may be mounted at a portion which does not hinder the mounting of the reflector 220, and the number of white LEDs to be provided is not limitative.

The invention claimed is:

1. A linear light source device comprising:
a light guide member that includes a main body made of a transparent material in the form of a column and having a substantially uniform cross section and a predetermined length, the light guide member also including a first end and a second end provided at ends of the main body; and LED elements each arranged to face one of the first end and the second end;
the main body includes a smooth mirror circumferential surface formed with a plurality of recesses or projections throughout the length thereof within a predetermined range in the circumferential direction,
due to the recesses or projections, throughout the length of the main body, light emitted from the LED elements and introduced into the main body through each of the first end and the second end is emitted from a region of the circumferential surface of the main body which faces the range within which the recesses or the projections are formed, and
each LED element comprises an LED chip, and each LED chip being directly mounted on a substrate made of aluminum nitride.

2. The linear light source device according to claim 1, wherein the transparent material is transparent resin or transparent glass.

3. The linear light source device according to claim 1, wherein the main body of the light guide member is in the form of a round column having a substantially uniform cross section.

4. The linear light source device according to claim 1, wherein the main body of the light guide member is in the form of an oval column having a substantially uniform cross section.

5. The linear light source device according to claim 1, wherein the plurality of recesses or projections are provided by forming a plurality of dents each having a spherical inner surface.

6. The linear light source device according to claim 1, wherein the main body of the light guide member is in the form of a polygonal prism having a substantially uniform cross section.

7. The linear light source device according to claim 6, wherein the main body which is in the form of a polygonal prism having a substantially uniform cross section includes a ridge line which is rounded in cross section.

8. The linear light source device according to claim 1, wherein the plurality of recesses or projections are provided by forming a plurality of grooves extending in a direction crossing a longitudinal axis of the main body at predetermined intervals.

9. The linear light source device according to claim 8, wherein each of the grooves has an inner surface which is generally arcuate in cross section.

10. The linear light source device according to claim 1, wherein, in the circumferential surface of the main body, the predetermined range in the circumferential direction of the main body within which the recesses or the projections are formed corresponds to a central angle of 3° to 45° of the main body.

11. An image reader comprising a light source device, a plurality of mirrors, a lens and a CCD line sensor which are housed in a case, the image reader being designed to guide light emitted from the light source device and reflected by a document to the CCD line sensor via the mirrors and the lens so that a linear image in a primary scanning direction of the document is read by the CCD line sensor;
wherein the light source device comprises the linear light source device as set forth in claim 10.

12. The image reader according to claim 11, wherein the plurality of recesses or projections of the main body of the light guide member are so formed that an amount of light to be emitted from the main body increases as progressing from a central portion toward each end in the longitudinal direction of the main body.

13. The linear light source device according to claim 1, wherein, in the circumferential surface of the main body, the predetermined range in the circumferential direction of the main body within which the recesses or the projections are formed corresponds to a central angle of 120° to 270° of the main body.

14. A flat display apparatus comprising a flat display panel and an illuminator for illuminating the flat display panel from behind,
wherein the illuminator is provided by arranging a plurality of linear light source devices as set forth in claim 13 side by side.

15. The flat display apparatus according to claim 14, further comprising a light diffusion sheet or a light diffusion panel arranged between the flat display panel and the illuminator.

16. The flat display apparatus according to claim 14, further comprising a light reflecting surface arranged on a side of the illuminator which is opposite from the flat display panel.

17. The linear light source device according to claim 1, wherein each substrate includes an LED element mount region for mounting the associated LED element and a heat dissipation region connected to the LED element mount region.

18. The linear light source device according to claim 17, wherein each substrate is formed with a common electrode pattern and a plurality of individual power supply electrode patterns, and wherein, at the LED element mount region, a plurality of LED chips are bonded close to each other on the common electrode pattern and each of the LED chips is connected to a corresponding one of the individual power supply electrode patterns via a wire.

19. The linear light source device according to claim 18, wherein each substrate is elongated, the LED element mount region being provided at one of longitudinally opposite ends of the substrate, the common electrode pattern and the individual power supply electrode patterns extending in parallel with each other on a remaining portion of the substrate in the longitudinal direction of the substrate.

20. The linear light source device according to claim 18, wherein the plurality of LED chips include at least one red LED chip, at least one green LED chip and at least one blue LED chip.

21. The linear light source device according to claim 20, wherein at least portions of the common electrode pattern and the individual power supply electrode patterns corresponding to the LED element mount region are formed by printing and baking silver paste.

22. The linear light source device according to claim 20, further comprising a frame-shaped reflector mounted to the LED element mount region of each substrate to surround the LED chips.

23. The linear light source device according to claim 22, wherein the end of the light guide member which faces the LED chip is integrally formed with a socket portion fitted to the frame-shaped reflector to accommodate the reflector.

24. The linear light source device according to claim 23, wherein the socket portion includes an outer surface covered with a light-impermeable layer.

25. The linear light source device according to claim 22, wherein the reflector includes an inner surface inclined to flare toward an upper opening of the reflector, the inner surface being a reflecting surface.

26. The linear light source device according to claim 25, wherein the reflector is made of white resin.

27. The linear light source device according to claim 25, wherein the reflector is made of resin and the inner surface is mirror finished.

28. A linear light source device comprising:
a light guide member that includes a main body made of a transparent material in the form of a column having a substantially uniform cross section and a predetermined length, the light guide also including a first end and a second end provided at ends of the main body; an LED element arranged to face the first end; and a reflecting portion formed at the second end;
the main body includes a smooth mirror circumferential surface formed with a plurality of recesses or projections throughout the length thereof within a predetermined range in the circumferential direction,
due to the recesses or projections, throughout the length of the main body, light emitted from the LED element and introduced into the main body through the first end is emitted from a region of the circumferential surface of the main body which faces the range within which the recesses or the projections are formed and
the LED element comprises an LED chip, the LED chip being directly mounted on a substrate made of aluminum nitride.

29. The linear light source device according to claim 28, wherein the reflecting portion comprises a reflecting surface extending perpendicularly to an axis of the main body.

30. The linear light source device according to claim 28, wherein the reflecting portion comprises two reflecting surfaces inclined substantially 45 degrees with respect to an axis of the main body.

31. The linear light source device according to claim 28, wherein the reflecting portion is in the form of a cone having a generatrix inclined substantially 45 degrees with respect to an axis of the main body.

32. The linear light source device according to claim 28, wherein the reflecting portion is in the form of a pyramid including a ridge line inclined substantially 45 degrees with respect to an axis of the main body.

33. The linear light source device according to claim 28, wherein the reflecting portion is covered with white resin.

34. The linear light source device according to claim 28, wherein the reflecting portion is formed by vapor deposition of metal.

35. The linear light source device according to claim 28, wherein the transparent material is transparent resin or transparent glass.

36. The linear light source device according to claim 28, wherein the main body of the light guide member is in the form of a round column having a substantially uniform cross section.

37. The linear light source device according to claim 28, wherein the main body of the light guide member is in the form of a polygonal prism having a substantially uniform cross section.

38. The linear light source device according to claim 28, wherein the main body of the light guide member is in the form of an oval column having a substantially uniform cross section.

39. The linear light source device according to claim 28, wherein the plurality of recesses or projections are provided by forming a plurality of grooves extending in a direction crossing a longitudinal axis of the main body at predetermined intervals.

40. The linear light source device according to claim 28, wherein the plurality of recesses or projections are provided by forming a plurality of dents each having a spherical inner surface.

41. The linear light source device according to claim 28, wherein, in the circumferential surface of the main body, the predetermined range in the circumferential direction of the main body within which the recesses or the projections are formed corresponds to a central angle of 3° to 45° of the main body.

42. The linear light source device according to claim 28, wherein, in the circumferential surface of the main body, the predetermined range in the circumferential direction of the main body within which the recesses or the projections are formed corresponds to a central angle of 120° to 270° of the main body.

* * * * *